(12) United States Patent
Back et al.

(10) Patent No.: US 9,999,127 B2
(45) Date of Patent: Jun. 12, 2018

(54) DEVICE CONNECTOR ASSEMBLY

(71) Applicant: Uber Technologies, Inc., San Francisco, CA (US)

(72) Inventors: Tyler Jon Back, San Francisco, CA (US); Irving M. D. Hu, San Francisco, CA (US); Adrian Timothy Fox, San Francisco, CA (US); James Matthew Collins, San Francisco, CA (US)

(73) Assignee: Uber Technologies, Inc., San Francisco, CA (US)

( * ) Notice: Subject to any disclaimer, the term of this patent is extended or adjusted under 35 U.S.C. 154(b) by 0 days. days.

(21) Appl. No.: 15/160,773

(22) Filed: May 20, 2016

(65) Prior Publication Data
US 2016/0344128 A1 Nov. 24, 2016

Related U.S. Application Data

(60) Provisional application No. 62/165,568, filed on May 22, 2015.

(51) Int. Cl.
| | |
|---|---|
| H01R 13/28 | (2006.01) |
| H05K 1/11 | (2006.01) |
| H01R 13/24 | (2006.01) |
| H01R 12/71 | (2011.01) |
| H01R 13/62 | (2006.01) |
| H01R 13/453 | (2006.01) |
| H01R 107/00 | (2006.01) |

(52) U.S. Cl.
CPC ........... *H05K 1/11* (2013.01); *H01R 13/2442* (2013.01); *H01R 12/718* (2013.01); *H01R 13/4538* (2013.01); *H01R 13/6205* (2013.01); *H01R 2107/00* (2013.01); *H05K 1/117* (2013.01); *H05K 2201/1034* (2013.01); *H05K 2201/10151* (2013.01)

(58) Field of Classification Search
CPC ......................... H01R 13/453; H01R 13/4538; H01R 13/523; H01R 2103/00; H01R 13/447
USPC ........ 439/287, 289, 140, 141, 862, 928, 700
See application file for complete search history.

(56) References Cited

U.S. PATENT DOCUMENTS

| | | | | |
|---|---|---|---|---|
| 4,289,366 A * | 9/1981 | Marks | ..................... | H01R 23/27 439/287 |
| 5,204,805 A * | 4/1993 | Takahashi | ............ | H05K 7/1474 211/41.17 |
| 5,505,635 A * | 4/1996 | Willows | .............. | H01M 2/1055 429/97 |
| 5,641,315 A * | 6/1997 | Swart | ................. | G01R 1/06722 324/72.5 |
| 6,038,130 A * | 3/2000 | Boeck | .................. | H01R 9/2675 361/729 |
| 6,250,945 B1 * | 6/2001 | Murakami | ......... | H01R 13/2421 439/353 |

(Continued)

*Primary Examiner* — Abdullah Riyami
*Assistant Examiner* — Vladimir Imas
(74) *Attorney, Agent, or Firm* — Mahamedi IP Law LLP

(57) ABSTRACT

A device is described having a body and a connector assembly. The connector assembly is positioned at one end of the body and includes a set of contacts and a cover having a façade. The cover also has a set of openings to enable at least a portion of the set of contacts to be exposed on the façade. The cover is at least partially moveable inwards towards the set of contacts when force is applied to the façade.

20 Claims, 16 Drawing Sheets

(56) References Cited

U.S. PATENT DOCUMENTS

| | | | | |
|---|---|---|---|---|
| 6,346,793 B1* | 2/2002 | Shibata | ............... | H02J 7/0042 |
| | | | | 320/107 |
| 6,896,529 B2* | 5/2005 | Jing | ............... | H01R 13/6275 |
| | | | | 439/135 |
| 6,935,901 B2* | 8/2005 | Simpson | ............ | H01R 13/2428 |
| | | | | 439/700 |
| 7,048,556 B2* | 5/2006 | Stanton | ............ | H04M 1/0274 |
| | | | | 439/135 |
| 7,070,458 B2* | 7/2006 | Axenbock | ............ | H01R 13/521 |
| | | | | 439/272 |
| 7,154,286 B1* | 12/2006 | Marx | ............... | H01R 13/2421 |
| | | | | 324/755.05 |
| 7,320,614 B2* | 1/2008 | Toda | ............... | H01R 12/725 |
| | | | | 439/217 |
| 7,402,068 B1* | 7/2008 | Tarchinski | ............ | B60L 3/0069 |
| | | | | 439/350 |
| 7,404,729 B2* | 7/2008 | Hong | ............... | H01R 13/2428 |
| | | | | 439/353 |
| 7,581,964 B2* | 9/2009 | Fujimaki | ............ | H01R 29/00 |
| | | | | 439/76.1 |
| 7,611,389 B2* | 11/2009 | Toivanen | ............ | H01R 13/2471 |
| | | | | 439/700 |
| 7,658,656 B2* | 2/2010 | Hsu | ............... | H01R 13/2421 |
| | | | | 324/755.05 |
| 7,704,084 B1* | 4/2010 | Cheng | ............... | H01R 13/447 |
| | | | | 439/131 |
| 8,363,386 B2* | 1/2013 | Cheng | ............... | G06F 1/1656 |
| | | | | 361/600 |
| 8,568,241 B2* | 10/2013 | Bailey | ............... | A63F 13/98 |
| | | | | 206/320 |

* cited by examiner

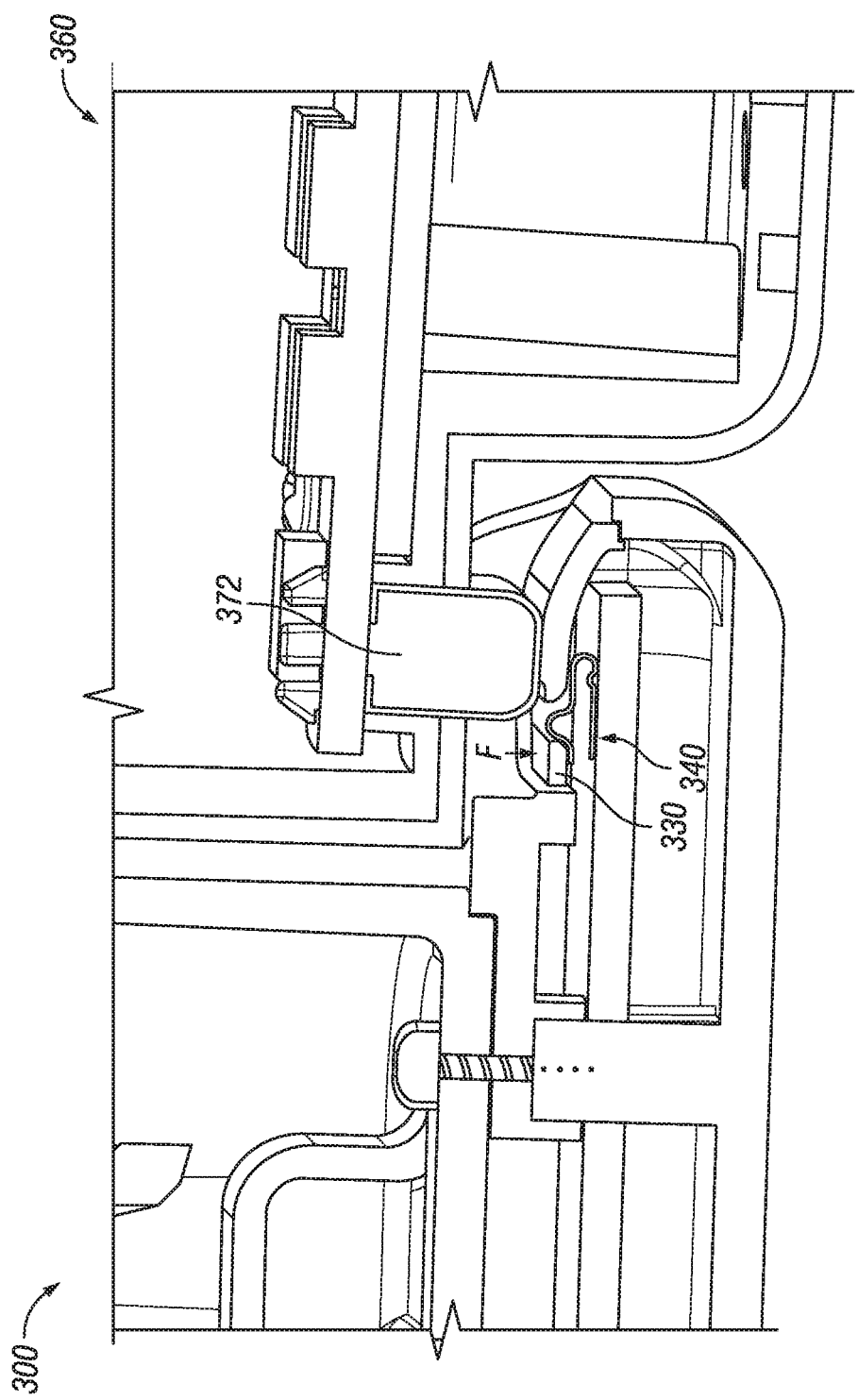

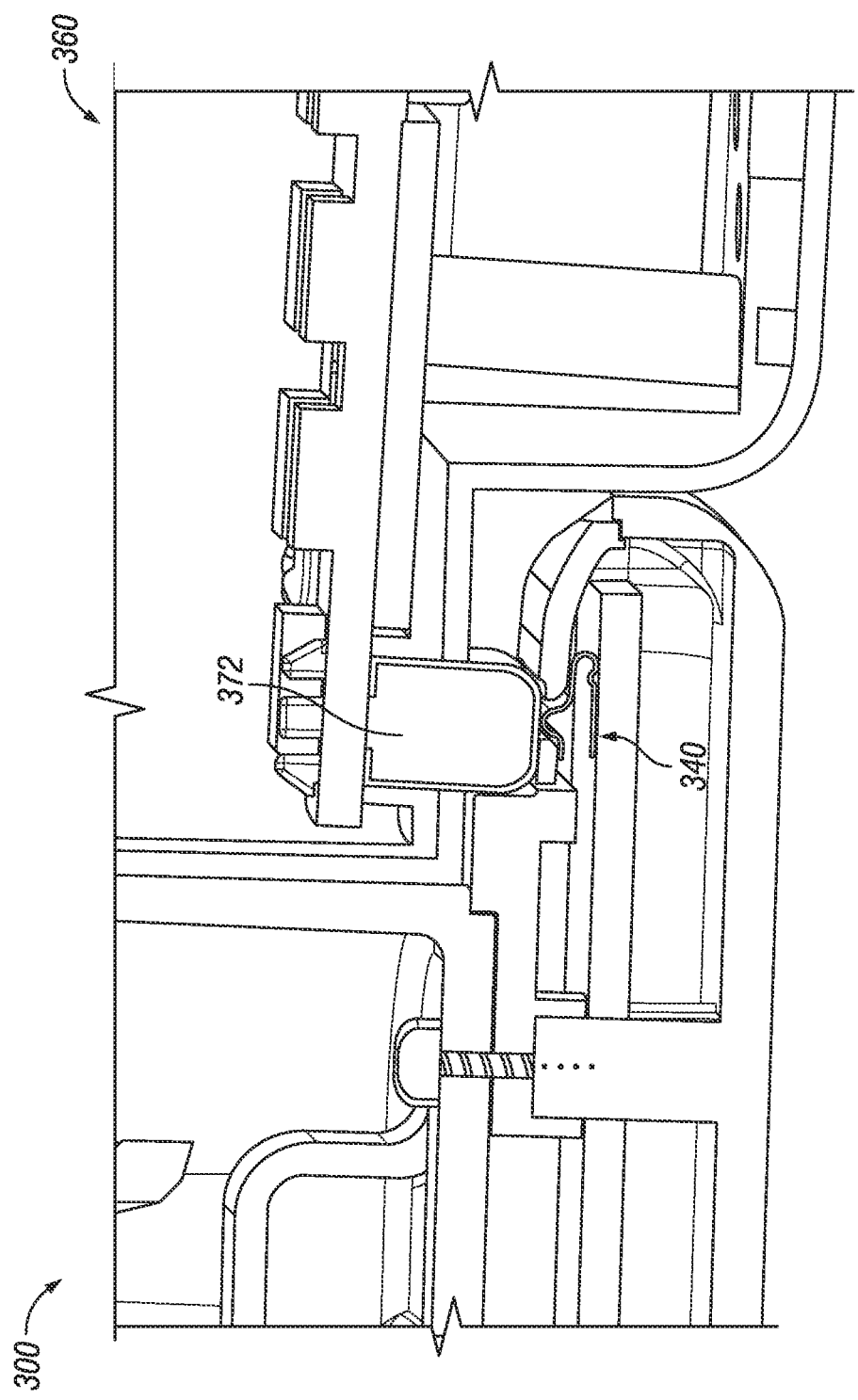

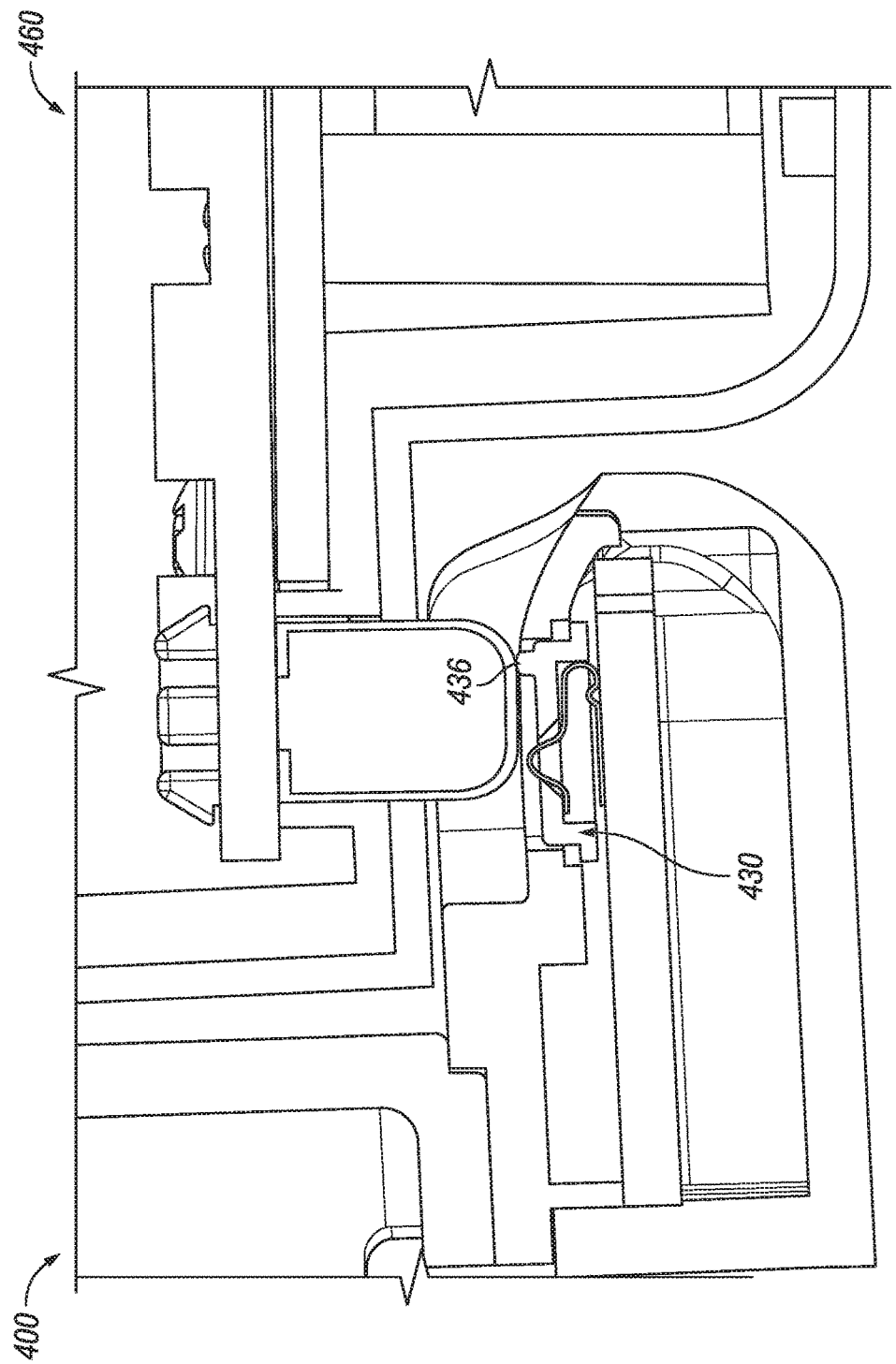

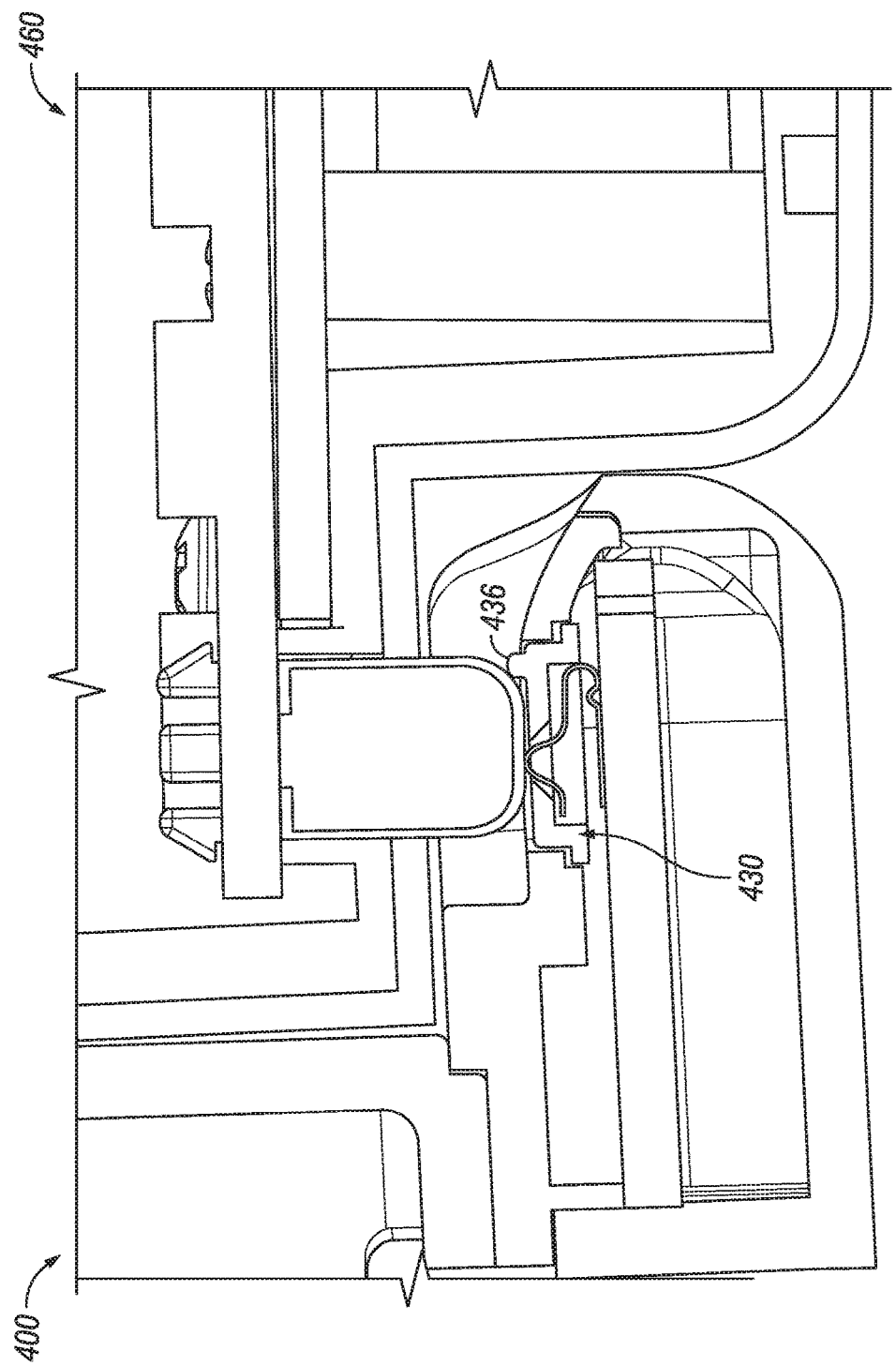

DEVICE CONNECTOR ASSEMBLY

RELATED APPLICATIONS

This application claims the benefit of U.S. Patent Application No. 62/165,568, filed May 22, 2015, entitled "Device Connector Assembly", the aforementioned priority application being hereby incorporated by reference in its entirety.

BACKGROUND

An electronic device system can be composed of two separate devices that can couple or decouple from each other. Each device can include a connector that can mate with each other when the devices are coupled together. In some examples, each time the devices are coupled together, the connector of one device can strike the connector of the other device, thereby causing the structure of one or both of the connectors to degrade over time.

BRIEF DESCRIPTION OF THE DRAWINGS

FIGS. 3A through 3E illustrate details of an example device system including a connector assembly, according to an embodiment.

FIGS. 4A through 4D illustrate another example device system including a connector assembly, according to another embodiment.

DETAILED DESCRIPTION

Figure 1A:
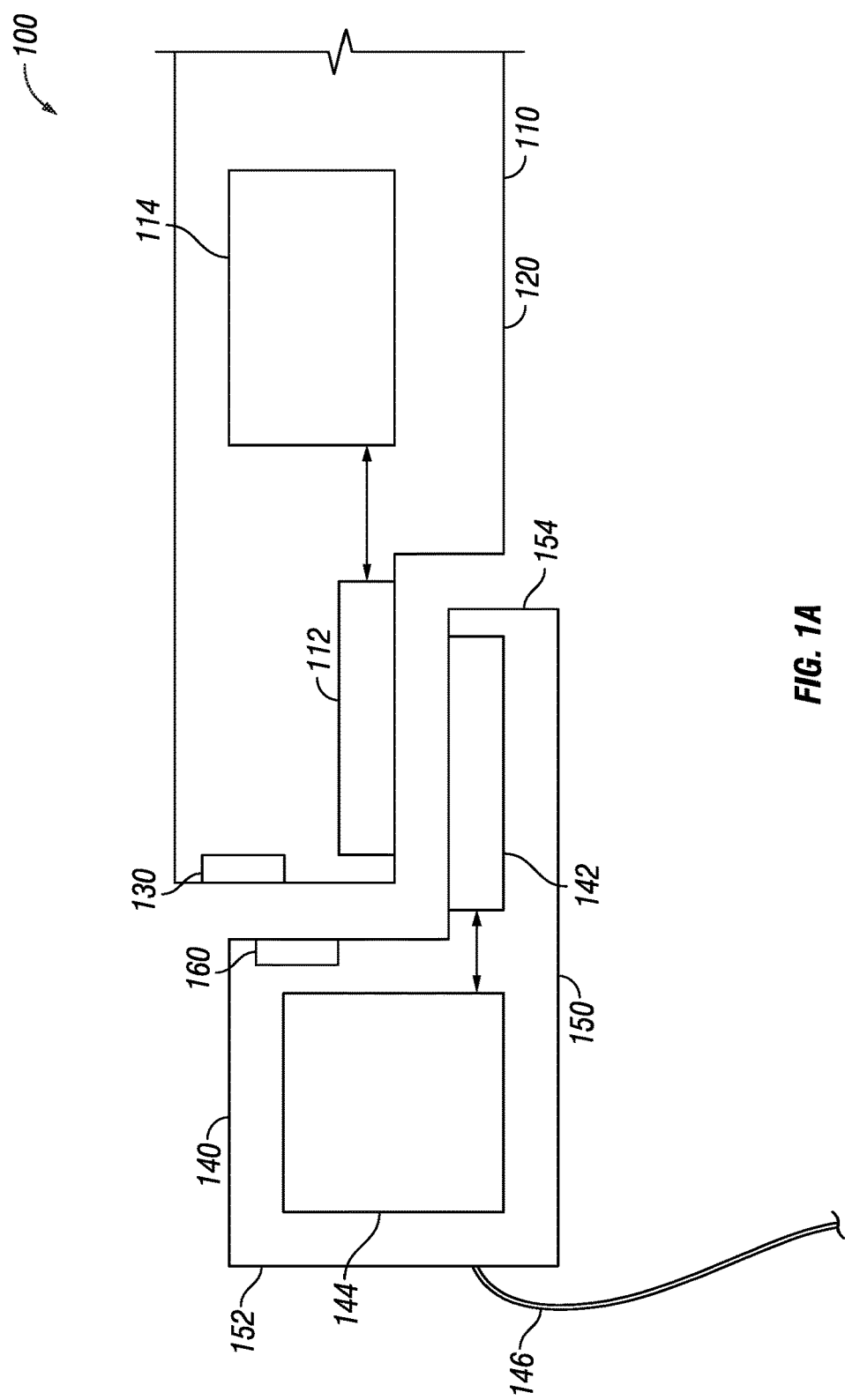
FIGS. 1A and 1B illustrate an example device system including a connector assembly, according to some embodiments.

Examples described herein provide for a device connector assembly that is used to electrically connect two devices of a device system. A device connector assembly, such as described herein, can be included in one or both of the two devices, and can be shaped or include a structure to protect the connector interface (or the electrical contacts) of that device so as to maintain the structural integrity of the connector interface.

According to an example, a device can include a body (or a housing) and a connector assembly that comprises a set of contacts and a cover (or a protective structure) that partially overlays each of the set of contacts. As referred to herein, a set of contacts can correspond to one or more electrical contacts or pins of a connector interface that can mate with or connect with another corresponding set of contacts of another connector interface. The set of contacts can be provided on a base (e.g., a structure that makes up the connector interface) or mounted on a printed circuit board (PCB). The cover can have a façade (e.g., an outward face) and a set of openings to enable at least a portion of each of the set of contacts to be exposed on the façade. The cover is also structured to be at least partially moveable inwards towards the set of contacts when force is applied to the façade (e.g., applied in a downward direction on the façade).

Depending on implementation, the cover of the connector assembly can be structured to have a first end that is free and a second end that is coupled to the body to enable the cover to flex or at least partially move inward when force is applied to the cover. Alternatively, the cover can be a moveable platform that rests on the set of contacts and that engages with an opening of the base of the recessed region. In some examples, each of the set of contacts can be a spring contact, so that when force is applied to the façade of the cover, the cover can move at least partially inwards and compress the set of spring contacts.

In one example, the façade of the cover of the connector assembly can includes a lip or a ramp that extends parallel along an edge of the second end of the body. The lip can be aligned with the set of openings of the cover. In addition, the lip can cause the height of the cover (e.g., from the top of the lip to the underlying PCB or the base) to be greater than the height of the set of contacts (e.g., from the exposed portions of the set of contacts to the PCB or the base). Because the lip is higher than the top of the set of the contacts that are partially exposed through the set of openings (in relation to the PCB or the base), if another connector assembly of another device is inserted or entered at an angle to mate with the connector assembly and applies force on the façade, the cover can flex or move inwards to compress the set of contacts. This can keep the set of contacts from being interfered with until the connector assembly of the other device is inserted and connected to the device.

The device can also include a set of electronic components that are coupled to or connected to the PCB, including, for example, at least one of (i) a global positioning system (GPS) receiver, (ii) one or more short-range wireless communication devices (e.g., a Bluetooth transceiver or WLAN transceiver, etc.), (iii) an inertial measurement unit, (iv) an altimeter, (v) an accelerometer, (vi) one or more ambient light sensors, or (vii) one or more controllers (e.g., a power controller, a device controller, etc.). In another example, the set of contacts can correspond to spring contacts that are mounted or coupled to the PCB using, for example, surface-mount technology (SMT). The electronic components can provide functionality for the device and the device system.

Still further, in one example, the body of the device has a first end and a second (opposing) end, and can be shaped or formed to have a recessed region having three side walls at one of the ends of the body. The recessed region of the device can be shaped to mate with a portion of the other device, such that when the two devices are mated, the recessed region receives the portion of the other device. The connector assembly can be positioned in the recessed region such that cover forms at least a portion of the base of the recessed region. In such an example, when the two devices are mated, the set of contacts of the connector assembly of one device can be aligned with the set of contacts of the other device.

According to an example, a device system described herein can includes a first device comprising a first body and a first connection assembly, and a second device comprising a second body and a second connection assembly. The first connection assembly can include a first set of contacts that is provided on a surface of an end portion of the first body, while the second connection assembly can include a second set of contacts and a cover that partially overlays each of the second set of contacts, such as described herein. According to an example, in the device system, the first device can correspond to an illumination device that is capable of outputting or emitting light and the second device can correspond to a controller device that provides at least one of power or data to the illumination device.

Among other benefits, some examples described herein recognize that connection interfaces can be subject to deterioration (e.g., contacts can be bed or displaced) as a result of repeated coupling and decoupling of device portions in which the connection interfaces are located. Among benefits and technical effects achieved with examples as described, a connector assembly of one device having a set of contacts and a cover that is at least partially moveable towards the set of contacts can shield the contacts from being struck or interfered with by another device until the devices are properly mated or coupled with each other.

System Description

Figure 1B:
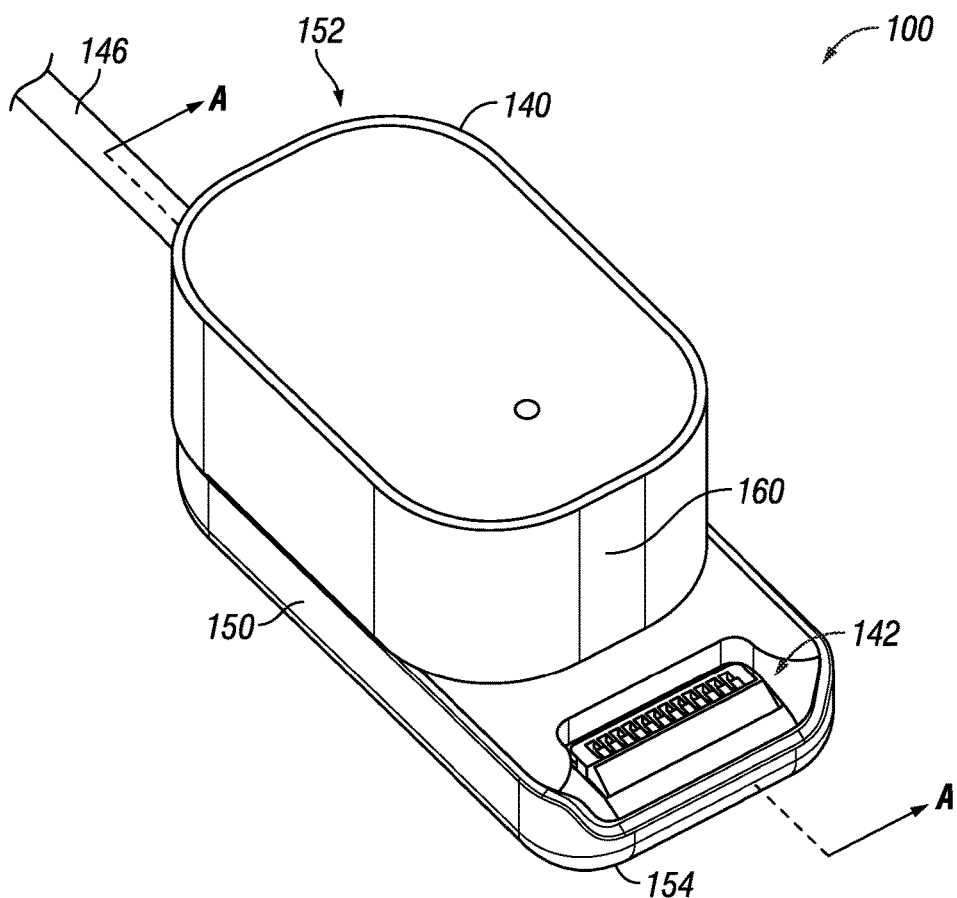
Figure 1B:
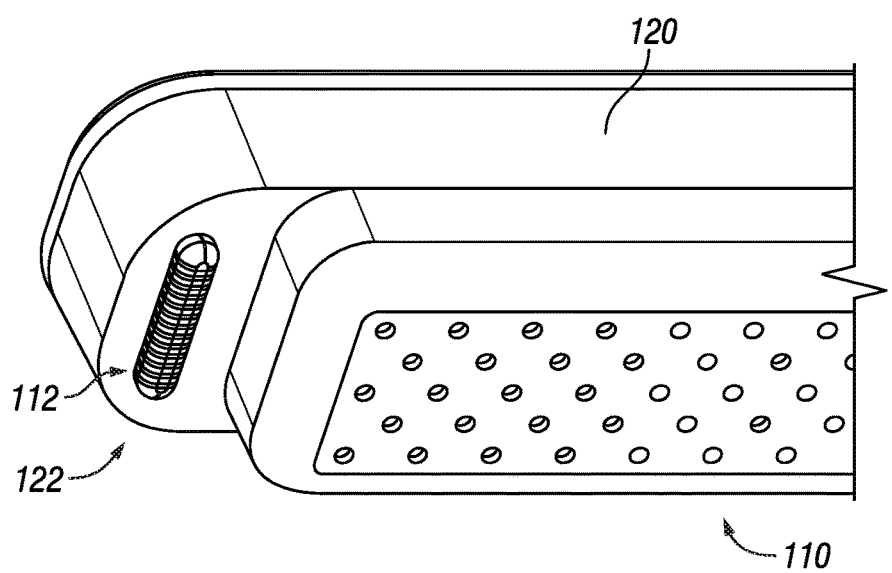

FIGS. 1A and 1B illustrate an example device system including a connector assembly, according to some embodiments. In the example of FIG. 1A, a device system 100 can comprise multiple devices having separate housings. For example, the device system 100 can include a first device 110 and a second device 140 that can couple and decouple from each other. The first device 110 can include a body 120 that houses or includes a first connector assembly 112 and a first set of electronic components 114, while the second device 140 can include a body 150 that houses or includes a second connector assembly 142 and a second set of electronic components 144. In one example, the body 150 can have a first end 142 and a second end 154, and the second connector assembly 142 can be positioned at or near the second end 154. The first device 110 and/or the second device 140 can also include a coupling mechanism(s) 130 and/or 160, respectively, that can assist or enable the first device 110 and the second device 140 to couple with each other.

In some examples, a portion of the body 120 of the first device 110 and a portion the body 150 of the second device 140 can be shaped or structured to complement each other so that the two devices are securely coupled together when the two devices are properly connected with each other. As referred to herein, two devices can be properly connected or properly mated together when the connector assemblies 112, 142 are aligned with each other (e.g., the contacts of the connector assembly 112 are electrically connected to the corresponding contacts of the connector assembly 142). When the connector assemblies 112, 142 are aligned with each other, data and/or power can be exchanged via the electrically connected sets of contacts.

According to one example, the first device 110 can correspond to an illumination or display device that is capable of emitting light or displaying content and the second device 110 can correspond to a controller device that can provide data and/or power to the illumination device. The set of electronic components 114 of the first device 110 can include, for example, a display screen or light sources, such as an array of light emitting diodes (LEDs), a printed circuit board (PCB), a display or light controller, various electronic components (e.g., resistors, capacitors, transistors, switches, etc.), and/or wires to interconnect various components. The set of electronic components 144 of the second device 140 can include, for example, a PCB, a power interface (e.g., such as one connected to the cable or cord 146), one or more controllers (e.g., a power controller, a device controller, etc.), one or more short-range wireless communication devices, one or more sensors (e.g., an IMU, a GPS receiver, an altimeter, an accelerometer, ambient light sensors, etc.), various electronic components, and/or wires to interconnect various components.

Still further, in some implementations, the device system 100 can be in communication with a peripheral device, such as a mobile computing device operated by a user, to exchange data via a short-range wireless communication device of the second device 140. For example, the second device 140 can receive data from the peripheral device to control the output of the first device 140 when the two devices are properly coupled together, and/or can transmit data provided by electronic components of the second device 140 to the peripheral device (e.g., sensor data detected by one or more sensors). While examples described herein pertain to an illumination device and a controller device, in other examples, the device system 100 can be any device system in which two devices can couple to one another to exchange data and/or power over a set of mated connector interfaces (e.g., mated sets of contacts).

FIG. 1B illustrates the shape of the housings of the device system 100 of FIG. 1B, according to one implementation. In the example of FIG. 1B, the body 120 of the first device 110 can have an overall width and an overall height that is equal to or substantially equal to (e.g., within 90% of a measurement of) the overall width and the overall height of the body 150 of the second device 120, respectively. As described herein, the bodies 120, 150 can also be structured to complement each other.

For example, the first device 110 can have a first end portion 122 that is structured to have a height that is shorter than the overall height (e.g., 75% of the overall h eight). The first connector assembly 112 can be positioned on the surface of the first end portion 122 having the shorter height. The second device 140 can be structured complement the first device 110, so that first end portion 152 has the overall height of the body 150, while the second end portion 154 has a height that is shorter than the overall height of the body 150 (e.g., 25% of the overall height). The second end portion 154 can also have a recessed region in which the second connector assembly 142 is provided, so that the first connector assembly 112 (e.g., where the set of contacts are provided on or as part of an elongated protrusion, as illustrated in FIG. 1B) can be inserted into the recessed region to mate with the second connector assembly 142. In this example, when the first end portion 122 of the first device 110 is properly coupled with the second end 154 of the second device 140, the height of the overlapping portions of the devices can be equal or substantially equal to the overall height of the bodies 120, 150.

FIG. 1B also illustrates a coupling mechanism 160 provided with the second device 140. The coupling mechanism 160 can enable the second device 140 to properly couple with the first device 110. Depending on implementation, the coupling mechanism 160 can correspond to an adhesive material, a magnetic material, a clasp or a fastener, a hook and loop fastener (e.g., either the hook or the loop can be provided on one device and the other can be provided on the other device), etc.

Figure 2A:
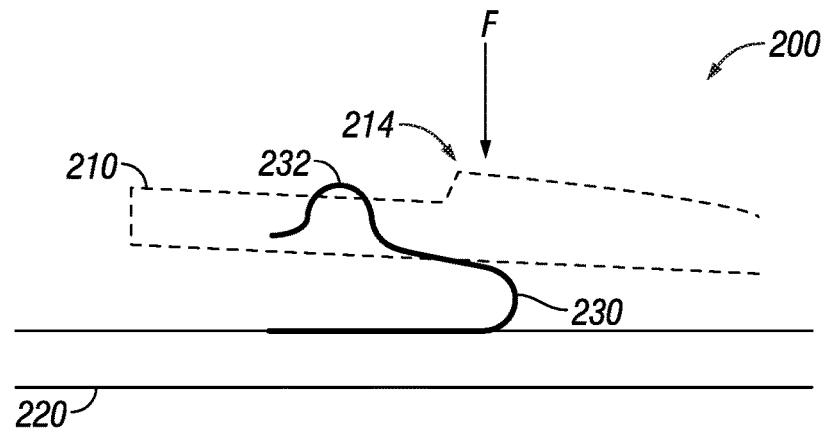
FIGS. 2A and 2B illustrate an example connector assembly, in one embodiment.
Figure 2B:
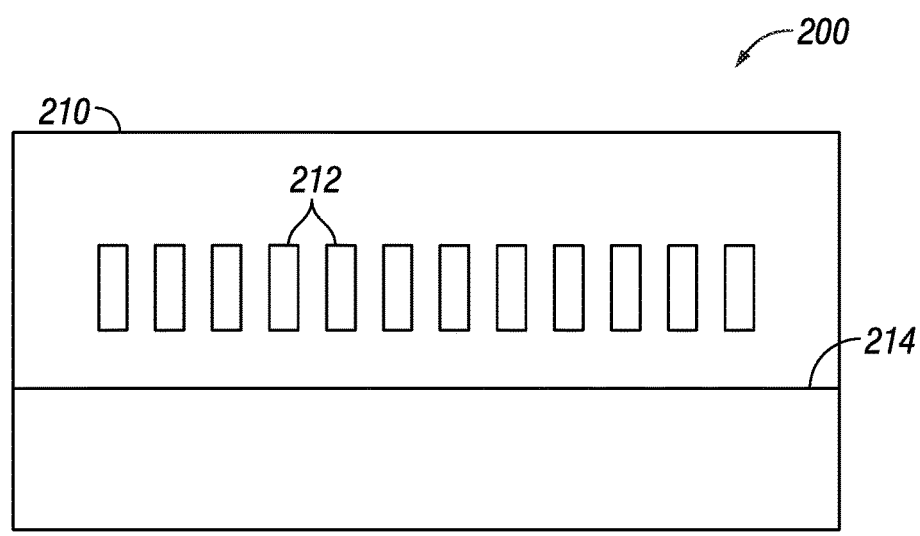

FIGS. 2A and 2B illustrate an example connector assembly, in one embodiment. According to an example, the connector assembly illustrated in FIGS. 2A and 2B can correspond to the connector assembly 142 of the second device 140 in FIGS. 1A and 1B. Referring to FIG. 2A, a side view illustration of a connector assembly 200 depicts a cover 210 that overlays at least a portion of a set of contacts 230. The set of contacts 230 can be aligned with each other and mounted on a contact base or a PCB 220. The cover 210 can include a set of openings 212, such as illustrated in FIG. 2B, which depicts a top view of the cover 210 of FIG. 2A, that align with the underlying set of contacts 230. In this example, twelve contacts can be mounted on the PCB and be aligned with twelve openings of the cover 210. In alternative implementations, the set of contacts 230 can be arranged non-linearly or in a grouping (e.g., two rows of six contacts) and the set of openings 212 can be similarly arranged to align with the set of contacts 230.

The openings 212 of the cover 210 can enable at least a portion (e.g., an upper portion 232) of each contact 230 to be exposed on or above the surface of the cover 210. For example, the cover 210 can have a thickness such that when the cover 210 is at rest (e.g., when no force is exerted downward on the façade of the cover 210 by the first device 110), the upper portion 232 of each contact 230 partially protrudes from the respective opening 212. In some examples, the set of contacts 230 can correspond to spring contacts that bias upwards (e.g., provide a force upwards away from the contact base 220) and that can be compressed downwards in response to force being exerted (e.g., "F" shown in FIG. 2A) on the façade of the cover 210.

Figure 3A:
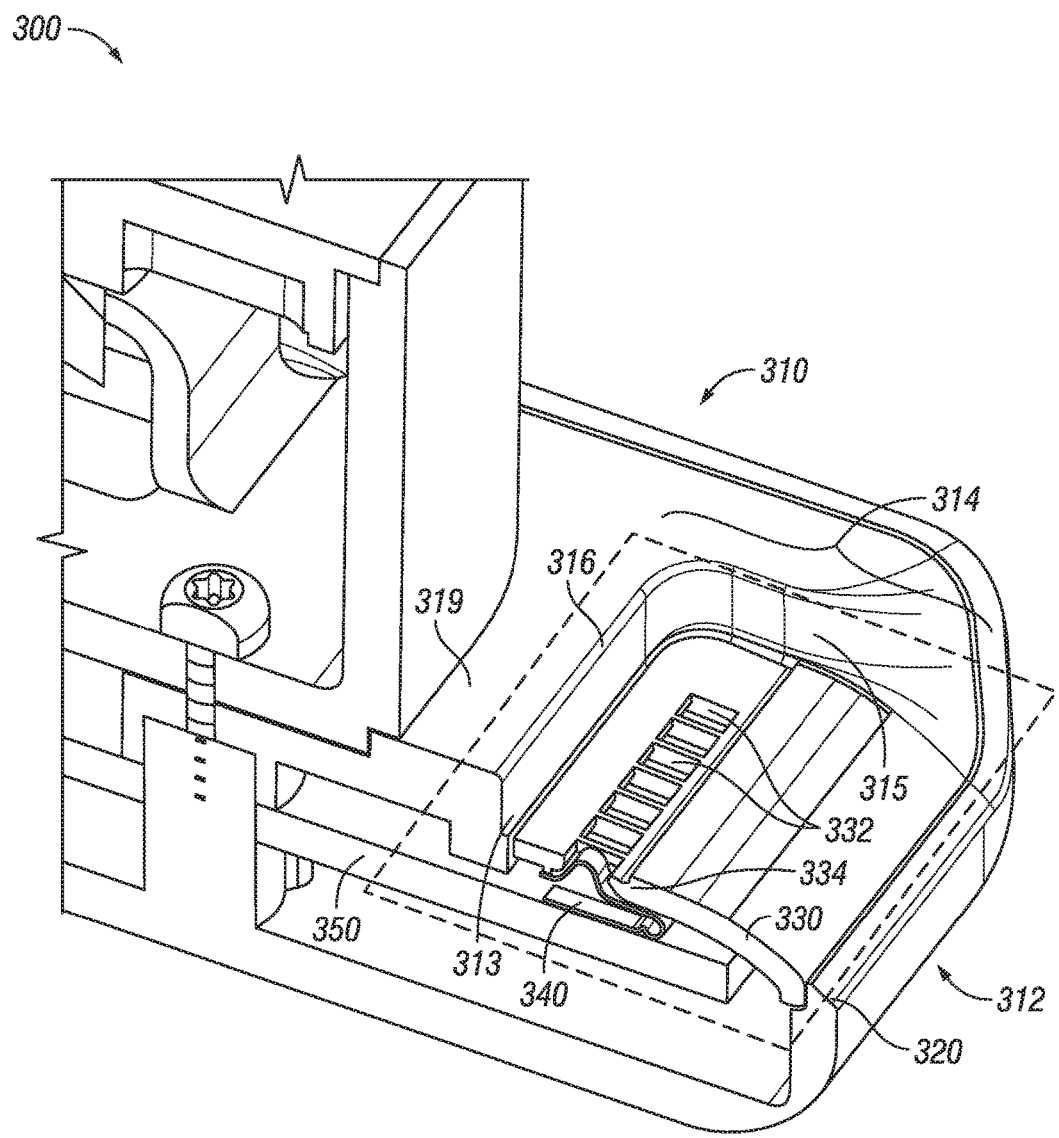

The cover 210 can also include a lip 214 that is aligned with the set of openings 212 and extends along the façade in a direction parallel to the edge of the end portion of the body (e.g., the body is not shown in FIGS. 2A and 2B for purposes of simplicity, but see FIG. 3A, for example). Depending on implementation, the lip 214 can be integrally formed as part of the façade or can be a separate structure that is joined or attached to the façade of the cover 210. The lip 214 can also be raised as compared to another portion of the cover 210, such as the portion where the openings 212 are positioned. Accordingly, in one example, the height of the cover 210 at the lip 214 (with respect to the contact base 220) can be higher or greater than the height of a contact 230 at the upper portion 232 that protrudes outwards or is exposed on the façade.

In some examples, the cover 210 can be at least partially moveable inwards towards the set of contacts 230. When force is exerted or applied to the façade of the cover 210 in the direction shown, the cover 210 can flex or bend downwards, and in some examples, can also compress the set of springs 230 (as described with FIGS. 3A through 3E). The cover 210 can be formed of a material that provides some elasticity, such as a plastic material, that substantially retains its shape at rest. As an addition or an alternative, the cover 210 can correspond to a moveable platform that can be moved or pressed downwards when force is applied to the façade of the cover 210 in the direction shown (as described with FIGS. 4A through 4D).

FIGS. 3A through 3E illustrate details of an example device system including a connector assembly, according to an embodiment. In one example, FIG. 3A can illustrate a cross-sectional view of the second device 140 of FIG. 1B along the line A-A. Referring to FIG. 3A, the device 300 can include a body 310 and a connector assembly 320 that is included with or housed, at least in part, by the body 310. As described with respect to FIGS. 1A and 1B, the body 310 can have a first end (not shown in FIG. 3A for simplicity) and a second end 312. In one example, the body 310 can also be structured to include a recessed region 314 that is positioned at or near the second end. As described herein, the recessed region 314 can be sunken, as compared to a level surface 319 of the body, such that thickness of the body 310 at the base 313 of the recessed region 314 is smaller than the thickness of the body 310 at the level surface 319 (and also smaller than the thickness at other portions of the body 310). In such an example, the recessed region 314 can be defined by the base 313 and a set of side walls, such as a first wall 315, a second wall 316, and a third wall 317 (see FIG. 3B).

According to an example, the connector assembly 320 can be provided in or as part of the recessed region 314. The cover 330 of the connector assembly 320 can form, at least in part, the base 313 of the recessed region 314, such as illustrated in FIG. 3A. The cover 330 can be structured to have a first end that is free (e.g., near the second wall 316 of the recessed region 316) and a second (opposing) end that is coupled to the body 310 (e.g., near the edge of the second end 312). Similarly, the cover 330 can be detached or disconnected from the body 310 along the sides (e.g., near the first wall 315 and the third wall 317). This structure enables the cover 330 to be at least partially moveable inwards towards the underlying set of contacts 340 when force is applied to the façade of the cover 330. The cover 330 can also be flush with the remaining parts of the base 313 when the cover 330 is at rest.

The cover 330 can include a set of openings 332 that align with a set of contacts 340 so that a portion of the contacts 340 can be exposed on the façade of the cover 330. The set of contacts 340 can be provided on or mounted on a frame or based or a PCB 350. In one example, the cover 330 can also include a lip 334 on the façade that extends parallel to the edge of the second end 312 of the body 310. The lip 334 can provide a structure that the other device (e.g., the first device 110 of FIG. 1B) can make contact with that causes force to be applied downwards on the façade of the cover 330. In one example, the contacts 340 can be spring contacts so that when the cover 330 moves at least partially downwards, the spring contacts can also be moved downwards so that the other device cannot make contact with the spring contacts until the contacts of the other device are properly mated with the spring contacts.

Figure 3B:
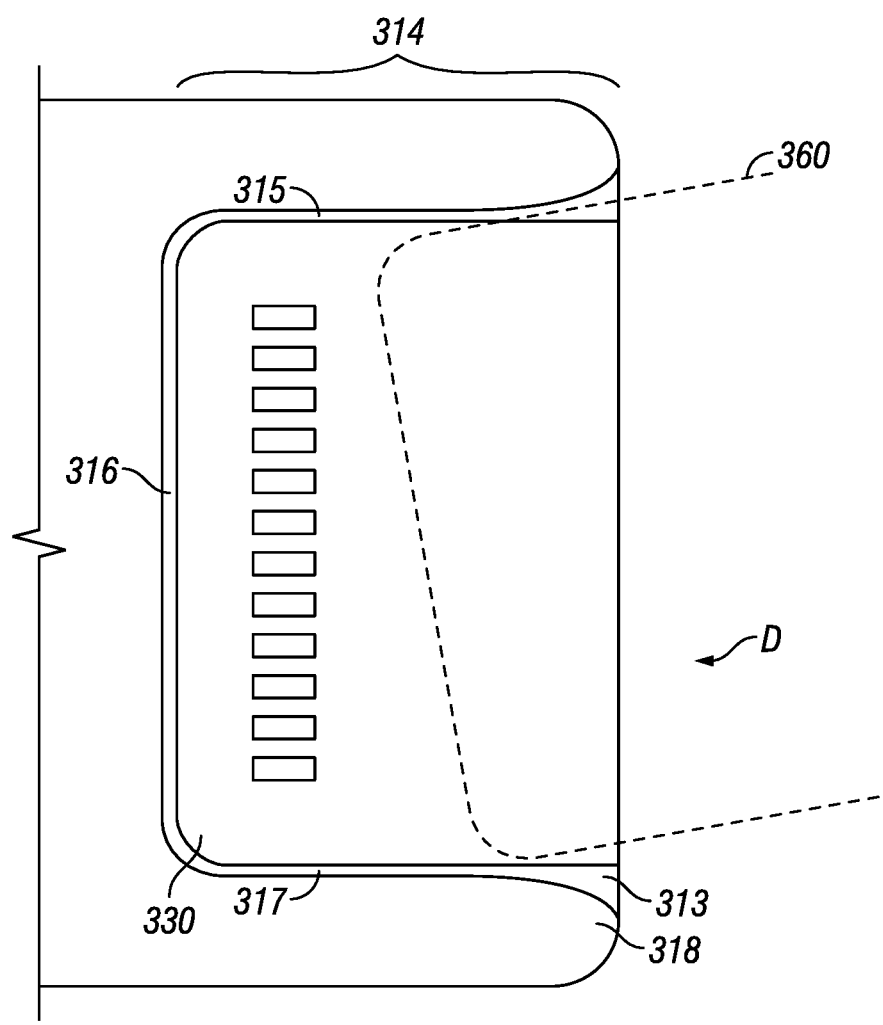

FIG. 3B illustrates a top view of the cover 330 of the connector assembly 320 of FIG. 3A, in one example. The cover 330, as illustrated in FIG. 3B, can include a set of openings 332 that align with a set of contacts 340. For purpose of simplicity, the lip 334 is not illustrated in FIG. 3B. The connector assembly 320 can be provided in the recessed region 314, which is defined by the three walls 315, 316, 317. The recessed region 314 can also include a curved wall 318 on the edge of the side walls 315, 317 to provide a larger area (from the viewpoint of the second end 312) for a portion of the other device to be inserted into the recessed region 314.

For example, FIG. 3B illustrates an end portion of another device 360 that is in the process of being coupled to the body 310 of the device 300. The end portion of the other device 360 can include a connector assembly, such as the connector assembly 112 of FIG. 1B, that includes a set of contacts to mate with the contacts 340. As illustrated in FIG. 3B, the curved walls 318 can enable the other connector assembly to be inserted into the recessed region 314 at an angle, such as in the direction, D (e.g., not inserted on the same axis or plane as the recessed region 314). If the connector assembly of the other device 360 applies force on the façade of the cover 330 while being inserted, e.g., by pressing down on the lip 334 of the cover 330, the cover 330 can move, at least partially, downwards towards the contacts 340. This can cause the contacts 340 to be pressed down as well, thereby preventing any one or more of the contacts 340 from being contacted by the other connector assembly. This can prevent one or more contacts 340 from being bent or displaced from the original position.

Still further, the cover 330 can form a part of the base 313 of the recessed region 314 and can be flush with the remaining portion of the base 313 when the cover 330 is at rest. The cover 330 can be partially separate from the remaining portion of the base 313 or the body 310 so that only one side (towards the edge of the second end 312) is coupled to the body. This can enable the cover 330 to be partially moveable towards the contacts 340.

Figure 3C:
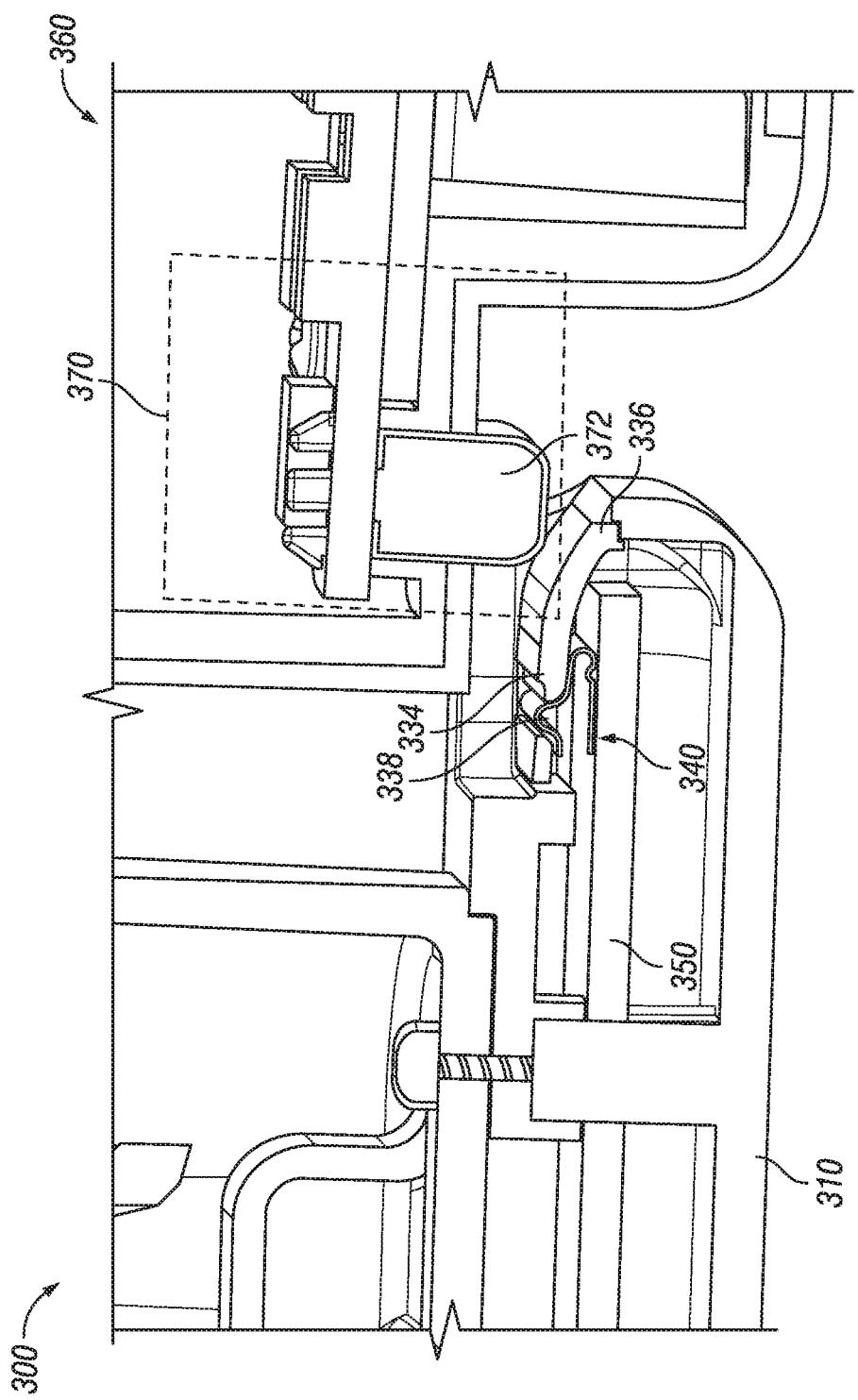

FIGS. 3C through 3E illustrate a cross-sectional side view of the connector assembly of FIG. 3A during a coupling process between the two devices 300, 360. The cross-sectional side view illustrates the cover 330 having an end 336 that is coupled to the body 320, but the other opposing end being free. This enables the cover 330 to be moveable, e.g., in the downward direction toward the base 350 when force is applied to the façade of the cover 330. The cover 330 also has a set of opening that are each shaped (e.g., have the shape 338) to match the shape of the portion of the contacts 340.

In one example, FIGS. 3C through 3E illustrate a sequence depicting the connector assembly 370 of the device 360 being inserted into the recessed region 314 to mate with the connector assembly 320 of the device 300. In FIG. 3C, the contacts 372 of the connector assembly 370 of the device 360 (such as the connector assembly 112 of FIG. 1B) have not yet made contact with the cover 330 of the connector assembly 320 of the device 300. Next, in FIG. 3D, the contacts 372 of the connector assembly 370 have made contact with the cover 330, e.g., by applying force (F) on the lip 334 that is protruding on the façade of the cover 330. As illustrated in FIG. 3D, the cover 330 has flexed or partially moved downwards (e.g., near the free end of the cover 330) so as to also compress the spring contacts 340. In this manner, the cover 330 can shield the contacts 340 so that the contacts 372 of the connector assembly 370 cannot interfere with or strike the contacts 340 before proper mating has occurred. When the connector assemblies 320, 370 are properly mated, however, such as illustrated in FIG. 3E, the contacts 340 and the contacts 372 can properly align with each other and mate.

Figure 4A:
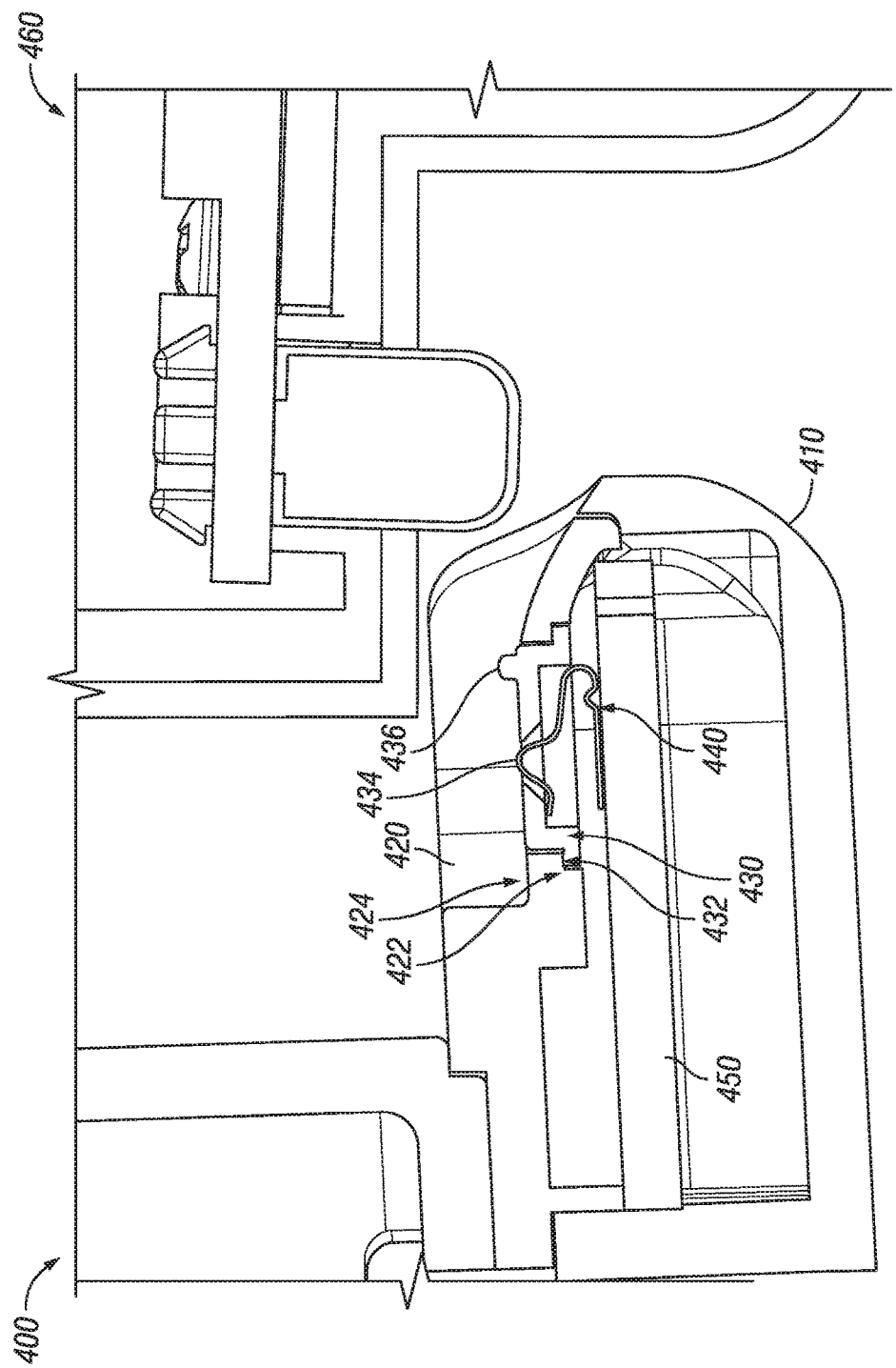

FIGS. 4A through 4D illustrate another example device system including a connector assembly, according to another embodiment. In FIG. 4A, the device 400 can include a body 410 and a connector assembly 420. The connector assembly 420 can include a cover 430 and a set of contacts 440 that are provided on the base 450 or a PCB. As described in one or more examples, the connector assembly 420 can be provided in or with a recessed region of the body 410. In this example, the recessed region includes a base 424 that has an opening in which the cover 430 can be positioned, so that the cover 430 can form, at least in part, the base 424 of the recessed region.

The cover 430 can be formed of or correspond to a moveable platform that can rest on the contacts 440 and that can engage with the edges of the opening of the base 424. The contacts 440 can be spring contacts that are biased to push the moveable platform away from the base 450 so that the edges 432 of the cover 430 can engage with the edges 422 of the base 424 when the cover 430 is at rest. The cover 430 can also include a lip 436 that protrudes outward from the façade of the cover 430, such as similarly described in FIGS. 1A through 3E.

Figure 4B:
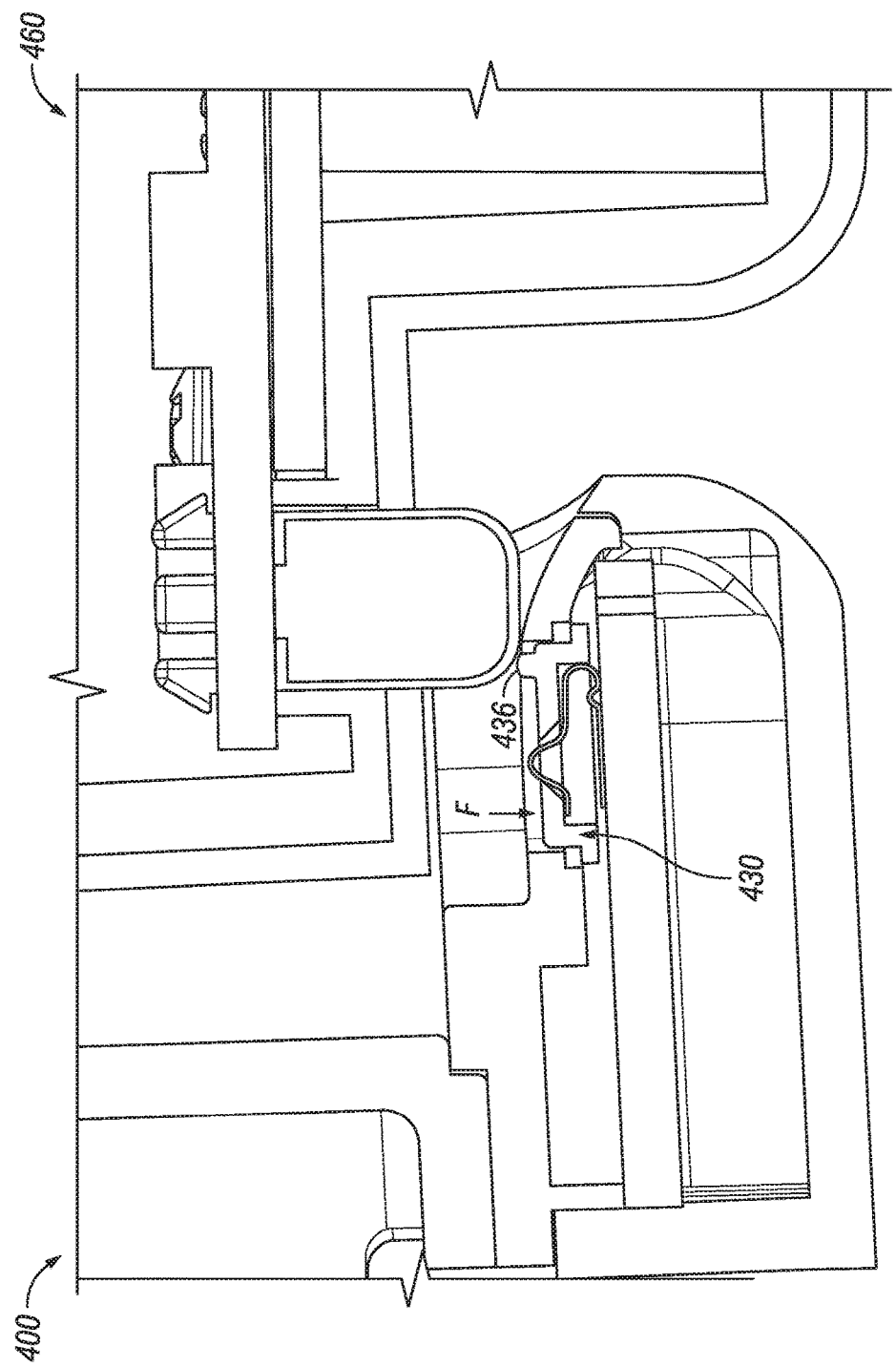

In FIG. 4B, the connector assembly of the device 460 is being inserted into the recessed region of the body 410 of the device 400. As shown in FIG. 4B, when the connector assembly of the device 460 (similar to the device 360 shown in FIGS. 3C through 3E) applies force (F) on the lip 436 of the cover 430, the force can cause the cover 430 to move in a downward direction toward the base 450. The cover 430 can also compress the spring contacts 440. FIG. 4C illustrates the connector assembly of the device 460 being further inserted into the recessed region of the body 410 of the device 400, and the cover 430 being further pressed down toward the base 450. During this time, the contacts of the device 460 are not in contact with the contacts 440 of the device 400. When the connector assembly of the device 460 is properly mated with the connector assembly 420 of the device 400, such as illustrated in FIG. 4D, the contacts of the device 460 can be properly mated with the contacts 440 of the device 400, thereby enabling the devices to be electrically connected.

Figure 5A:
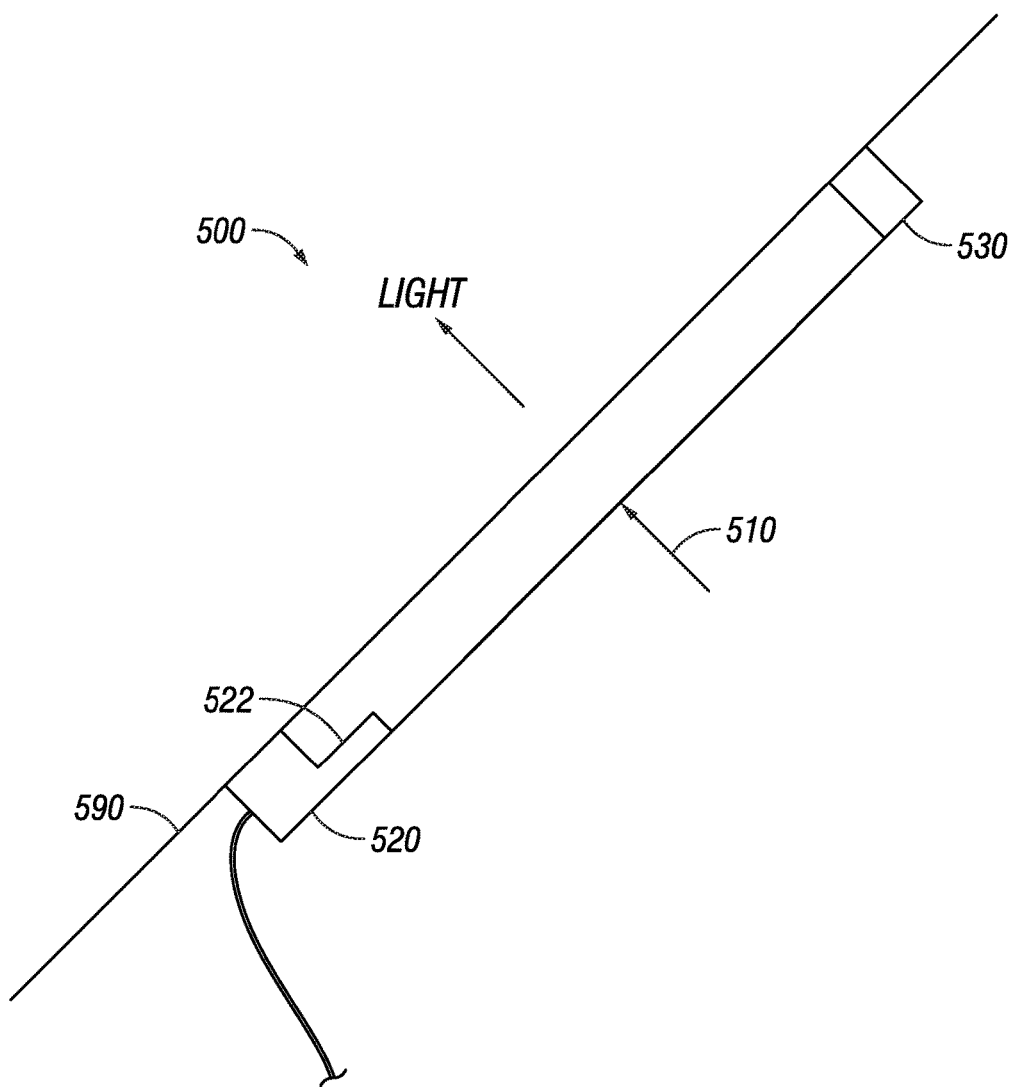
FIGS. 5A through 5C illustrate various examples of the connector assembly in connection with a device system.
Figure 5B:
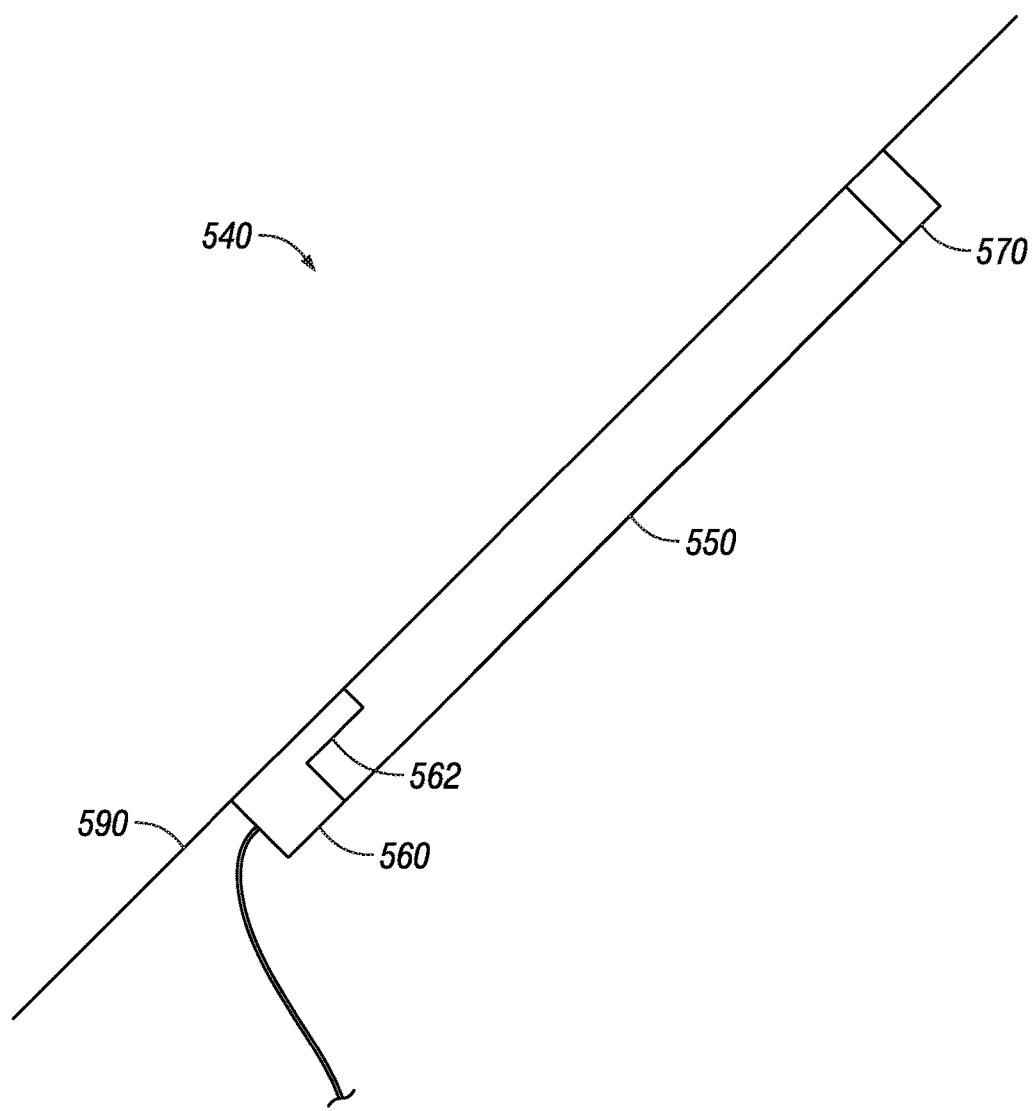
Figure 5C:
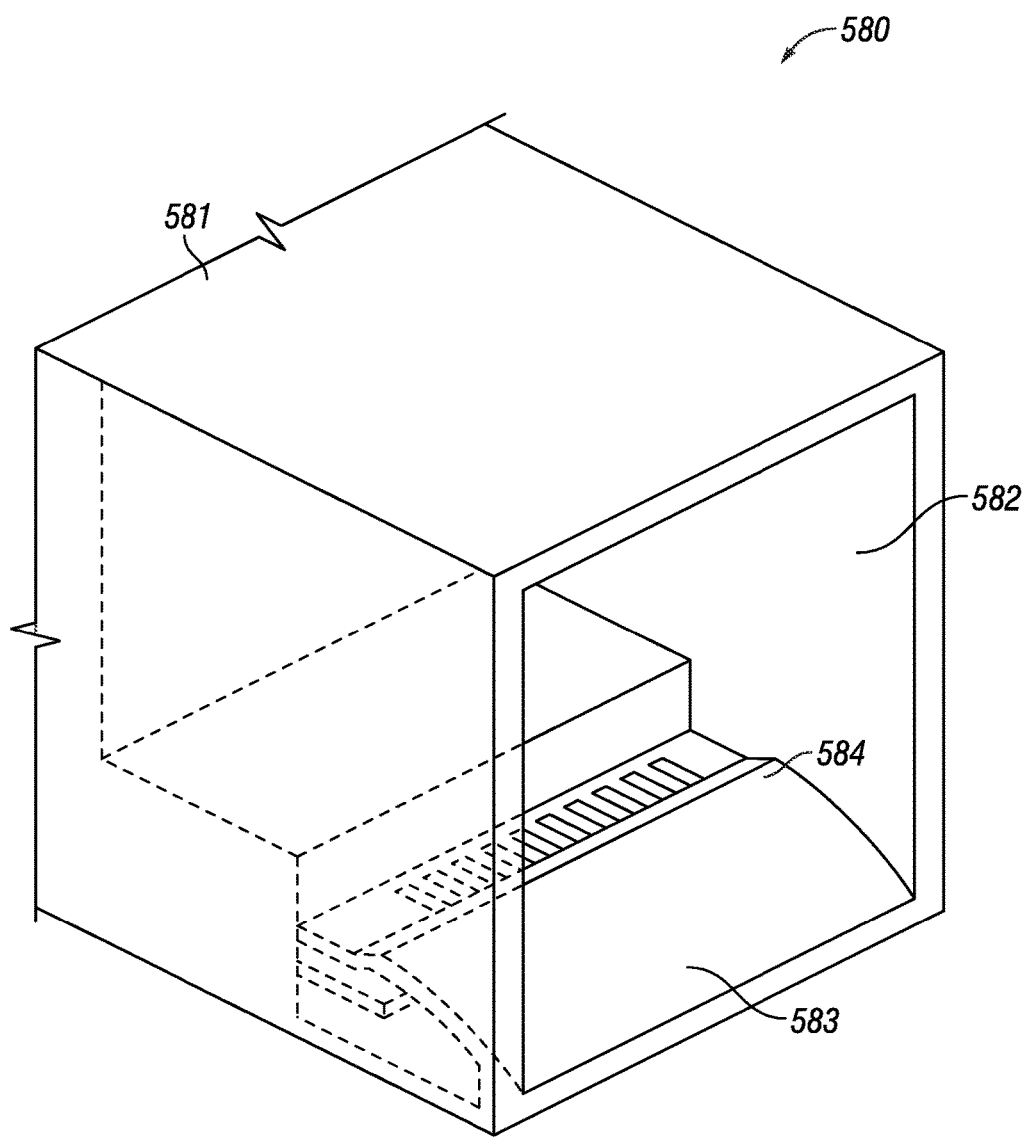

FIGS. 5A through 5C illustrate various examples of the connector assembly in connection with a device system. FIG. 5A illustrates a device system 500 that corresponds to a lighting device, as used in a vehicle environment. The device system 500 can include a first device 510 and a second device 520, which can correspond to, for example, the devices described in FIGS. 1A through 4D. The first device 510 can correspond to an illumination device, while the second device 520 can correspond to a controller device. The second device 520 can include the connector assembly 522, such as illustrated in FIG. 3A, to couple with the first end of the first device 510. The device system 500 can also include, in one example, a third device 530 or a coupling mechanism to couple with the second end of the first device 510.

According to an example, the device system 500 can be shaped to have an elongated body (such as illustrated in FIG. 5A and FIG. 1B). The body can house one or more light sources or a display to illuminate at least a portion of the façade in the direction shown in FIG. 5A. The device system 500 can also include one or more fastening mechanisms to enable the device system 500 to adhere to a surface, such as, for example, on a surface of the vehicle or an interior surface of a window of a vehicle or a windshield 590. For example, the second device 520 can have a fastening or attachment mechanism to adhere to the windshield 590 (e.g., on the top surface of the body 150 of the device 140 in FIG. 1B). Such a fastening or attachment mechanism can correspond to a suction mechanism, an adhesive material, hook and loop fasteners, etc. Similarly, the third device 530 or coupling mechanism can also have a fastening or attachment mechanism to adhere to the windshield 590. In some examples, the device system 500 can be curved to match the curvature of the windshield 590.

When the device system 500 is in use, a user can easily couple the first device 510 with the second device 520 using the connector assemblies of the respective devices, as described in FIGS. 1A through 4D. The structure of the body of the second device 520 can enable the user to insert or attach the first end of the first device 510 to the second device 520 in a variety of directions, and the connector assembly 522 can prevent the contact(s) of the connector interface from being damaged. The third device 530 or coupling mechanism can also provide stability for the first device 510 to remain in the appropriate position when the second end of the first device 510 couples to the third device 530. Similarly, when the user wants to remove the first device 510, such as when the user is no longer driving the vehicle, the user can easily decouple the first device 510 from the second device 520 and the third device 530 or coupling mechanism. The second device 530 and the third device 530 can remain adhered to the surface while decoupling from the first device 510.

FIG. 5B illustrates another example of a device system 540. The device system 540 is similar to the device system 500 of FIG. 5A, but the first device 550 is shaped differently than the first device 510 of FIG. 5A. For example, the second device 560 can be shaped to have the larger surface of the body be adhered to a surface, such as a windshield 590.

Depending on implementation, the connector assembly 562, such as the connector assembly 320 as illustrated in FIG. 3A, can be positioned on the second device 560. In alternative examples, the connector assembly 522 of FIG. 5A or the connector assembly 562 of FIG. 5B can be provided on the first device 510, 550, respectively.

FIG. 5C illustrates another example of a device that includes a connector assembly. The device 580 can correspond to a first device or a second device of the device system described herein. In this example, the device 580 can have a body 581 that is shaped to enclose, at least in part, a portion of a housing of another device. The device 580 can include a connector assembly 582, such as described in FIGS. 1A through 3E, which includes a cover 583 and a lip 584. The end portion of the other device can be shaped to be inserted into the body 581 to properly couple with the device 580. In some examples, such a device 580 can correspond to a port (e.g., a female connector) for a plug (e.g., a male connector).

Hardware Diagram

Figure 6:
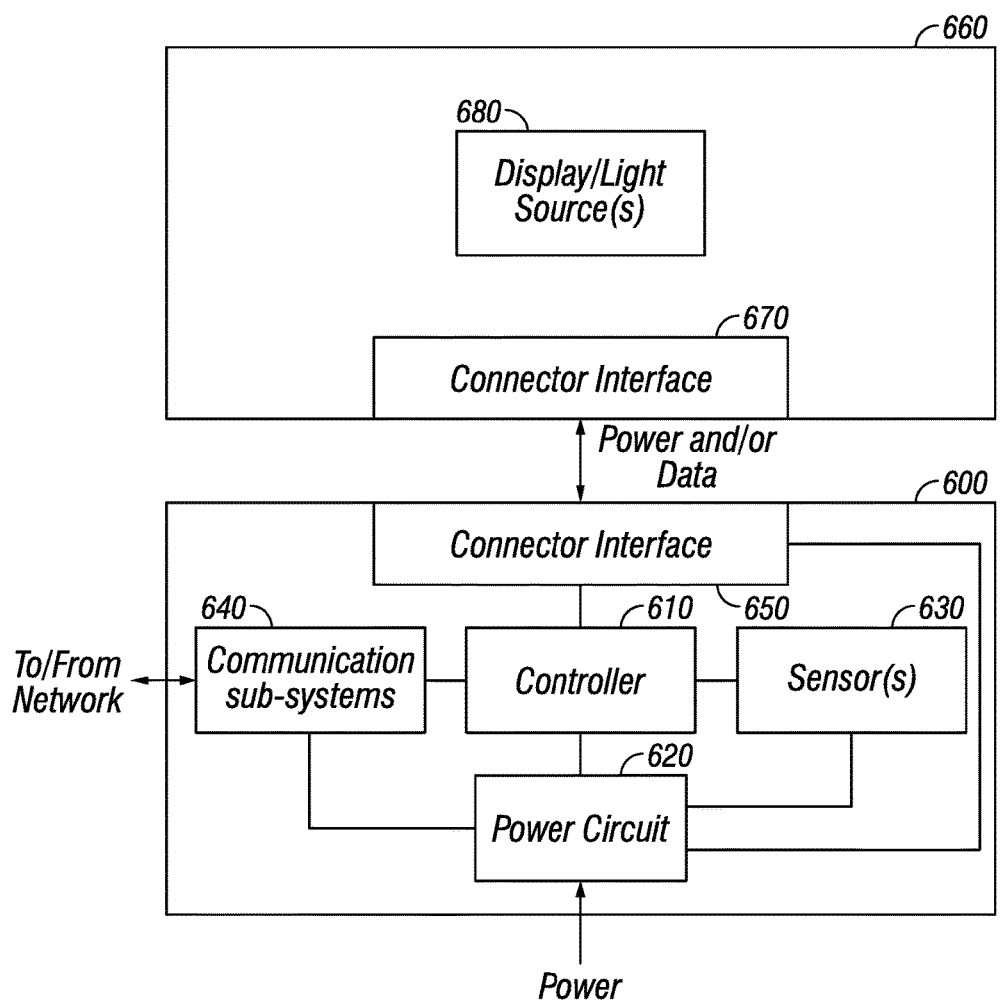
FIG. 6 is a block diagram that illustrates a device system upon which examples described herein may be implemented.

FIG. 6 is a block diagram that illustrates a device system upon which examples described herein may be implemented. For example, in the context of FIGS. 1 through 5C, a device system can be in multiple housings and can correspond to a first device 600 and a second device 660 that can couple together.

The first device 600 can include a controller(s) 610, a power circuit or controller 620, one or more sensors 630, one or more communication sub-systems 640, and a connector interface 650. The connector interface 650 can include a set of contacts and can be provided as part of a first connector assembly having a cover that overlays the set of contacts, such as described in FIGS. 1 through 5C. The second device 660 can include a connector interface 670 that also includes a corresponding set of contacts and can be provided as part of a different connector assembly that can mate with the first connector assembly of the first device 600. Alternatively, the second device 660 can include the connector assembly having the cover that overlays the set of contacts, such as described in FIGS. 1 through 5C and the first device 600 can include the corresponding connector assembly to mate with the connector assembly of the second device 600. The first and/or second devices 600, 660 can also include one or more coupling mechanisms to securely couple the devices together.

A power source, such as a battery or an external power source, can provide power to the first device 600. For an external power source (e.g., provided by a power source of the vehicle of the user in possession of the device system or the user mobile computing device), the power circuit 620 can receive power via a cord or a cable that is connected or plugged into a port of the first device 600 (not shown in FIG. 6). The power circuit 620 can provide power to the components of the first device 600. In some examples, when the first device 600 and the second device 660 are properly coupled together, the connector interfaces 650, 670 can enable power to be provided from the first device 600 to the second device 660. The display or light source(s) 680 of the second device can be powered by the received power via the connector interfaces 650, 670.

According to some examples, the first device 600 can receive data from a network or a peripheral device (e.g., the user's mobile computing device) using a communication sub-system 640 (e.g., a short-range wireless communication device, such as a Bluetooth device). The controller 610 can receive control data, which can be used by the controller 610 (and/or a display or light controller of the second device 660, in one example), to control the illumination and/or display of the display or light source(s) 680. The display or light source(s) 680 can output or emit light or display content in a specified manner based on the control data exchanged via the connector interfaces 650, 670. For example, the control data can control the color(s), the pattern(s), the illumination sequence(s), text, visual content, video, and/or audio outputted by the second device 660.

The controller 610 and/or the power circuit 620 can be programmed to control the device system. One or more examples described herein provide that methods, techniques, and actions performed by a computing device are performed programmatically, or as a computer-implemented method. Programmatically, as used herein, means through the use of code or computer-executable instructions. These instructions can be stored in one or more memory resources of the computing device. A programmatically performed step may or may not be automatic.

It is contemplated for examples described herein to extend to individual elements and concepts described herein, independently of other concepts, ideas or system, as well as for examples to include combinations of elements recited anywhere in this application. Although examples are described in detail herein with reference to the accompanying drawings, it is to be understood that the concepts are not limited to those precise examples. Accordingly, it is intended that the scope of the concepts be defined by the following claims and their equivalents. Furthermore, it is contemplated that a particular feature described either individually or as part of an example can be combined with other individually described features, or parts of other examples, even if the other features and examples make no mentioned of the particular feature. Thus, the absence of describing combinations should not preclude having rights to such combinations.

What is being claimed is:

1. A device, comprising:
a body having a first end and a second end; and
a connector assembly positioned at the second end, the connector assembly comprising:
a set of contacts; and
a cover having a façade and having a set of openings to enable at least a portion of each of the set of contacts to be exposed on the façade, wherein the cover is at least partially moveable inwards towards the set of contacts when force is applied to the façade.

2. The device of claim 1, further comprising:
a printed circuit board (PCB) or a contact base;
wherein the set of contacts are mounted on the PCB or the contact base.

3. The device of claim 2, further comprising:
a set of electronic components, including one or more of (i) a global positioning system receiver, (ii) a short-range wireless communication device, (iii) an inertial measurement unit, (iv) an altimeter, (v) an accelerometer, (vi) one or more ambient light sensors, or (vii) a power controller.

4. The device of claim 3, wherein a cable extends outwards from the first end of the body and is connected to the power controller.

5. The device of claim 2, wherein the façade of the cover includes a lip that extends parallel along an edge of the second end of the body, and wherein a height of the cover from the lip to the PCB or the contact base is greater than a height of the set of contacts from the exposed portions of the set of contacts to the PCB or the contact base.

6. The device of claim 2, wherein the body is structured to have a recessed region having three side walls, and wherein the connector assembly is positioned in the recessed region such that the cover forms at least a portion of a base of the recessed region.

7. The device of claim 6, wherein the cover has a first end that is free and a second end that is coupled to the body.

8. The device of claim 6, wherein each of the set of contacts is a spring contact that can be compressed toward the PCB when force is applied to the façade of the cover.

9. The device of claim 8, wherein the cover comprises a moveable platform that rests on the set of spring contacts, the set of spring contacts being biased to push the moveable platform away from the set of spring contacts such that a set of edges of the moveable platform engages with a set of edges of the base of the recessed region.

10. The device of claim 1, further comprising:
one or more coupling mechanisms to enable the device to couple with a second device;
wherein when the device couples with the second device, the set of contacts of the connector assembly mates with a second set of contacts of the second device.

11. A system, comprising:
a first device comprising a first body and a first connection assembly having a first set of contacts; and
a second device comprising a second body and a second connection assembly, the second connection assembly comprising:
a second set of contacts; and
a cover having a façade and having a set of openings to enable at least a portion of each of the second set of contacts to be exposed on the façade, wherein the cover is at least partially moveable inwards towards the second set of contacts when force is applied to the façade;
wherein the first device is structured to couple with the second device, such that when the first device couples with the second device, the first set of contacts mates with the second set of contacts.

12. The system of claim 11, wherein when the first set of contacts mates with the second set of contacts, at least one of power or data can be exchanged between the first device and the second device.

13. The system of claim 12, wherein one of the first device or the second device corresponds to an illumination device, and the other of the first device or the second device corresponds to a controller device that provides at least one of power or data to the illumination device.

14. The system of claim 11, wherein the second device further comprises:
a printed circuit board (PCB) or a contact base;
wherein the second set of contacts are mounted on the PCB or the contact base.

15. The system of claim 14, wherein one of the first device or the second device further comprises:
a set of electronic components, including one or more of (i) a global positioning system receiver, (ii) a short-range wireless communication device, (iii) an inertial measurement unit, (iv) an altimeter, (v) an accelerometer, (vi) one or more ambient light sensors, or (vii) a power controller.

16. The system of claim 14, wherein the façade of the cover includes a lip that extends parallel along an edge of the second end of the body, and wherein a height of the cover from the lip to the PCB or the contact base is greater than a height of the set of contacts from the exposed portions of the set of contacts to the PCB or the contact base.

17. The system of claim 14, wherein the second body is structured to have a recessed region having three side walls, and wherein the second connector assembly is positioned in the recessed region such that the cover forms at least a portion of a base of the recessed region.

18. The system of claim 17, wherein the cover has a first end that is free and a second end that is coupled to the second body.

19. The system of claim 17, wherein each of the second set of contacts is a spring contact that can be compressed toward the PCB when force is applied to the façade of the cover.

20. The system of claim 19, wherein the cover comprises a moveable platform that rests on the second set of spring contacts, the second set of spring contacts being biased to push the moveable platform away from the second set of spring contacts such that a set of edges of the moveable platform engages with a set of edges of the base of the recessed region.

* * * * *